US010831102B2

(12) United States Patent
De Silva et al.

(10) Patent No.: US 10,831,102 B2
(45) Date of Patent: Nov. 10, 2020

(54) PHOTOACTIVE POLYMER BRUSH MATERIALS AND EUV PATTERNING USING THE SAME

(71) Applicant: International Business Machines Corporation, Armonk, NY (US)

(72) Inventors: Ekmini A. De Silva, Slingerlands, NY (US); Rudy J. Wojtecki, San Jose, CA (US); Dario Goldfarb, Dobbs Ferry, NY (US); Daniel P. Sanders, San Jose, CA (US); Nelson Felix, Slingerlands, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 165 days.

(21) Appl. No.: 15/911,320

(22) Filed: Mar. 5, 2018

(65) Prior Publication Data

US 2019/0271913 A1 Sep. 5, 2019

(51) Int. Cl.
| C09D 133/04 | (2006.01) |
| G03F 7/004 | (2006.01) |
| G03F 7/039 | (2006.01) |
| G03F 7/095 | (2006.01) |
| G03F 7/11 | (2006.01) |
| G03F 7/40 | (2006.01) |
| G03F 7/20 | (2006.01) |
| G03F 7/26 | (2006.01) |
| G03F 7/16 | (2006.01) |

(52) U.S. Cl.
CPC ............ *G03F 7/11* (2013.01); *C09D 133/04* (2013.01); *G03F 7/0045* (2013.01); *G03F 7/0392* (2013.01); *G03F 7/095* (2013.01); *G03F 7/16* (2013.01); *G03F 7/165* (2013.01); *G03F 7/2004* (2013.01); *G03F 7/26* (2013.01); *G03F 7/40* (2013.01)

(58) Field of Classification Search
CPC . G03F 7/095; G03F 7/11; G03F 7/165; G03F 7/16; G03F 7/2004; G03F 7/0392; G03F 7/40; G03F 7/0045; C09D 133/04; C08L 51/06; C08L 33/06; C08L 53/00; C08L 33/14
See application file for complete search history.

(56) References Cited

U.S. PATENT DOCUMENTS

| 4,197,132 | A | * | 4/1980 | Yazawa et al. ......... G03F 7/032 |
| | | | | 430/263 |
| 4,357,413 | A | * | 11/1982 | Cohen et al. ............ G03F 7/34 |
| | | | | 430/252 |
| 4,401,745 | A | * | 8/1983 | Nakane et al. ....... G03F 7/0085 |
| | | | | 430/197 |
| 4,433,044 | A | * | 2/1984 | Meyer et al. ......... G03F 7/0758 |
| | | | | 216/62 |
| 7,033,739 | B2 | | 4/2006 | Goldstein et al. |
| 7,115,534 | B2 | | 10/2006 | Nguyen et al. |
| 7,723,008 | B2 | | 5/2010 | Meagley et al. |
| 7,790,350 | B2 | | 9/2010 | Breyta et al. |
| 9,244,345 | B1 | * | 1/2016 | Ishimaru ............... C08F 226/06 |
| 9,388,268 | B2 | | 7/2016 | Gopalan et al. |
| 10,345,702 | B2 | * | 7/2019 | Glodde ...................... G03F 7/11 |
| 2003/0134231 | A1 | * | 7/2003 | Tsai et al. ............. G03F 7/0758 |
| | | | | 430/312 |
| 2004/0086800 | A1 | | 5/2004 | Meagley |
| 2011/0091814 | A1 | * | 4/2011 | Endo ......................... G03F 7/11 |
| | | | | 430/302 |
| 2013/0127021 | A1 | | 5/2013 | Millward |
| 2015/0024597 | A1 | | 1/2015 | Gao et al. |
| 2015/0072292 | A1 | * | 3/2015 | Cho ...................... G03F 7/0757 |
| | | | | 430/285.1 |
| 2016/0122580 | A1 | * | 5/2016 | Hong ................. H01J 37/32009 |
| | | | | 216/95 |
| 2018/0179575 | A1 | * | 6/2018 | George ................ C09D 183/06 |

FOREIGN PATENT DOCUMENTS

| EP | 0 318 956 A1 | * | 6/1989 | |
| WO | WO-2019171188 A1 | * | 9/2019 | ................ G03F 7/11 |

OTHER PUBLICATIONS

Brown et al "Polymer brush resist for responsive wettability", Soft Matter, vol. 5, year 2009, pp. 2738-2745 from Royal Society of Chemistry. (Year: 2009).*

Hinestrosa et al, Journal or Book Title: Polymer Preprints (American Chemical Society, Division of Polymer Chemistry) / Polym. Prepr. (Am. Chem. Soc., Div. Polym. Chem.) Volume and Issue No. vol. 50 Issue: 1 Pages: No - pp. given Publication Date: 2009 (Year: 2009).*

Hensarling et al , Polymer Preprints (American Chemical Society, Division of Polymer Chemistry) / Polym. Prepr. (Am. Chem. Soc., Div. Polym. Chem.) Volume and Issue No. vol. 52 Issue: 2 pp. 1014-1015 Publication Date: 2011 ISSN/ISBN: 00323934 0032-3934 (Year: 2011)*

(Continued)

*Primary Examiner* — Cynthia Hamilton
(74) *Attorney, Agent, or Firm* — Cantor Colburn LLP; Daniel Morris

(57) ABSTRACT

Photoactive polymer brush materials and methods for EUV photoresist patterning using the photoactive polymer brush materials are described. The photoactive polymer brush material incorporates a grafting moiety that can be immobilized at the substrate surface, a dry developable or ashable moiety, and a photoacid generator moiety, which are bound to a polymeric backbone. The photoacid generator moiety generates an acid upon exposure to EUV radiation acid at the interface, which overcomes the acid depletion problem to reduce photoresist scumming. The photoacid generator moiety can also facilitate cleavage of the photoactive polymer brush material from the substrate via an optional acid cleavable grafting functionality for the grafting moiety. The dry developable or ashable moiety facilitates complete removal of the photoactive brush material from the substrate in the event there is residue present subsequent to development of the chemically amplified EUV photoresist.

10 Claims, No Drawings

(56) References Cited

OTHER PUBLICATIONS

Gao et al, J. Am. Chem. Soc. 2007, vol. 129, pp. 6633-6639 (Year: 2007).*
Indira Seshadri et al, "Ultrathin extreme ultraviolet patterning stack using polymer brush as an adhesion promotion layer," J. Micro/Nanolith. MEMS MOEMS 16(3), 033506 (2017), doi: 10.1117/1.JMM.16.3.033506. Published online Aug. 28, 2017. (Year: 2017).*
Seshadri et al., "Ultrathin EUV patterning stack using polymer brush as an adhesion promotion layer," Proc. of SPIE, vol. 10143, 2017, 101431D, 11 pages.

* cited by examiner

PHOTOACTIVE POLYMER BRUSH MATERIALS AND EUV PATTERNING USING THE SAME

BACKGROUND

The present invention generally relates to EUV lithography, and more particularly, to photoactive polymer brush materials and methods for patterning EUV photoresists using the photoactive polymer brush materials.

Lithography is utilized for the fabrication of semiconductor structures, such as integrated circuits and micromechanical structures. The basic process of producing a semiconductor structure involves the modification of the surface material of a semiconductor substrate, such as of silicon, in a pattern. The interplay of the material changes and the pattern defines the electrical characteristics of the microelectronic device. A similar process can be used to form micromechanical devices, by, for example, electroplating metal structures in a desired pattern onto a substrate. Lithography is used to define the pattern on the substrate, which will be doped, etched, or otherwise modified to form the microelectrical or micromechanical device.

In a basic lithography process for the fabrication of semiconductor structures, a photoresist is deposited on a substrate surface. The photoresist is sensitive to radiation, e.g., extreme ultraviolet (EUV) radiation, and, depending on the photoresist used, portions of the photoresist that are exposed to the radiation can be removed (or left remaining) by a development process. The semiconductor structure is formed by etching or otherwise modifying the substrate in the areas from which the photoresist has been removed. To form a desired pattern in the photoresist, the radiation that is used to expose the photoresist is passed through or reflected off of a lithography mask that defines the pattern that is to be transferred to the photoresist.

SUMMARY

Embodiments of the present invention are generally directed to photoactive polymer brush materials and methods for patterning EUV photoresists using the photoactive polymer brush materials. A non-limiting example of a photoactive polymer brush material includes a grafting moiety, a dry developable moiety, and a photoacid generating moiety. The grafting moiety includes a grafting component selected from the group consisting of alkynes, alkenes, phosphonic acid, thiols, and silanes, and an acid cleavable component. The photoacid generating moiety is configured to decompose and form an acid upon exposure to EUV radiation.

A non-limiting example method for forming a relief image in a positive tone chemically amplified EUV photoresist according to embodiments of the invention includes grafting a monolayer of a photoactive polymer brush material onto a substrate, wherein the photoactive polymer brush material includes a grafting moiety, a dry developable moiety, and a photoacid generating moiety. A positive tone chemically amplified EUV photoresist is applied onto the monolayer of the photoactive polymer brush material. The positive tone chemically amplified EUV photoresist and the photoactive polymer brush material are exposed to EUV radiation to form a latent image within the chemically amplified EUV photoresist and generate acid at an interface between the photoresist and the substrate. A developer is applied to the substrate to form a relief image in the chemically amplified EUV photoresist and cleave at least a portion of the photoactive polymer brush material from the substrate.

A non-limiting example method for generating an acid at an interface between a substrate and a positive tone chemically amplified EUV photoresist according to embodiments of the invention includes grafting a monolayer of a photoactive polymer brush material onto a substrate, wherein the photoactive polymer brush material includes an acid cleavable grafting moiety, a dry developable moiety, and a photoacid generating moiety. A positive tone chemically amplified EUV photoresist is applied onto the monolayer of the photoactive polymer brush material. The positive tone chemically amplified EUV photoresist is exposed to EUV radiation, wherein the radiation decomposes the photoacid generating moiety in the photoactive polymer brush material to form an acid at the interface between the substrate and the positive tone chemically amplified EUV photoresist in an amount effective to reduce scumming of the positive tone chemically amplified EUV photoresist after development thereof compared to exposing without the photoactive polymer brush material.

Additional features and advantages are realized through the techniques of the present invention. Other embodiments and aspects of the invention are described in detail herein and are considered a part of the claimed invention. For a better understanding of the invention with advantages and features, refer to the description.

DETAILED DESCRIPTION

The present invention generally relates to photoactive polymer brush materials and methods for patterning positive tone chemically amplified EUV photoresists using the photoactive polymer brush materials. One of the problems with chemically amplified photoresist pattern formation in EUV lithography is the observation of scumming after development of the irradiated pattern in the chemically amplified EUV photoresist, wherein the term "scumming" is generally defined as residual amounts of photoresist remaining on the surface after development. While not wanting to be bound by theory, it is believed that the scumming present after patterning and development of chemically amplified EUV photoresists can be attributed to acid depletion at an interface between the substrate and the photoresist that subsequently prevents the acid catalyzed reaction of the photoresist polymer at the interface. The lack of acid at the resist hardmask interface can be attributed to the stochastics nature of EUV exposure. The number of EUV photons to reach a specific dose is significantly fewer compared to 193 nm exposures due to the high energy in each photon. Hence, any small variation can cause significant lack of acid generation at the interface. As the deposited chemically amplified EUV photoresists becomes thinner and thinner for advanced design rules, resist scumming at the interface in the developed (i.e., open) area becomes a significant part of the unexposed resist height that needs to mask the pattern transfer of the open area.

Positive tone chemically amplified EUV photoresists generally include a polymeric resin that provides most of the properties of the photoresist film, a photoacid generator, and an optional base. The fundamental differences in acid generation between DUV (deep UV) and EUV necessitates innovation in patterning materials development. In DUV exposures, photons are absorbed by chromophores of the photoacid generator (PAG) molecules in the resist matrix, which causes decomposition and acid production. For a similar dose-to-size, the number of EUV photons are significantly less due to the high energy contained in each photon. Because of this, EUV photons have sufficient energy to ionize resist molecules, which emit secondary electrons that interact with the resist matrix to generate acid. The generated acid attacks acid labile protecting groups causing an acid catalyzed deprotection reaction within the polymer resin. As a direct result, exposed areas have a higher dissolution rate than the unexposed areas, which can be removed with a developer. The opposite is true for negative tone photoresists, wherein an acid catalyzed crosslinking reaction is effected upon exposure to the activating energy. Aspects of the present invention are generally directed to photoactive polymer brushes and methods for patterning positive tone chemically amplified EUV photoresists using the photoactive polymer brushes. As noted above, depletion of acid at the interface of the substrate in the open areas can result in scumming, which can be eliminated with the use of the photoactive polymer brush materials at the interface between the substrate surface and the positive tone chemically amplified EUV photoresist.

In embodiments of the present invention, a relatively thin layer of the photoactive polymer brush material is grafted onto the substrate surface prior to deposition of the chemically amplified EUV photoresist to provide a photoresponsive monolayer at a thickness of generally less that about 10 nanometers (nm) at the interface between the substrate and the photoresist. In one or more embodiments of the invention, the thickness is less than 6 nm. In one or more embodiments of the invention, the thickness is less than 4 nm. As will be described in greater detail below, in one or more embodiments of the invention, the photoactive polymer brush material incorporates a grafting moiety that can be immobilized at the substrate surface, a dry developable/ashable moiety, and a photoacid generator moiety, all of which are bound to a polymeric backbone. The photoacid generator moiety generates an acid upon exposure to secondary electrons that were emitted due ionization of the polymer matrix from EUV radiation acid at the interface, which overcomes the acid depletion problem to reduce photoresist scumming. Moreover, the photoacid generator moiety can facilitates cleavage of the photoactive polymer brush material from the substrate via the optional acid cleavable grafting functionality. The dry developable/ashable moiety facilitates complete removal of the photoactive brush material from the substrate in the event there is residue present subsequent to development of the chemically amplified EUV photoresist.

Detailed embodiments of the photoactive polymer brush materials and methods for EUV photoresist patterning using the photoactive polymer brush material according to aspects of the present invention will now be described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures, if any, are not necessarily to scale, and some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings, if any, are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), and/or other semiconductor devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOS s, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

As used herein, the term "substrate" means and includes an exposed material or construction upon which materials, such as photoresist materials, can be deposited or otherwise formed. The substrate can be a semiconductor substrate, a base semiconductor on a supporting structure, a metal electrode, or a semiconductor substrate having one or more layers, structures, or regions formed thereon. While materials described and illustrated herein can be formed as layers, the materials are not limited thereto and can be formed in other three-dimensional configurations. The substrate can be a silicon substrate or other bulk substrate including a semiconductive material. As used herein, the term "bulk substrate" means and includes silicon wafers, silicon-on-insulator ("SOI") substrates, such as silicon-on-sapphire ("SOS") substrates or silicon-on-glass ("SOG") substrates, epitaxial layers of silicon on a base semiconductor foundation or other semiconductor or optoelectronic materials, such as silicon-germanium (Si1-xGex, where x can be, for example, a mole fraction between 0.2 and 0.8), germanium (Ge), gallium arsenide (GaAs), gallium nitride (GaN), or indium phosphide (InP). Furthermore, when reference is made to a "substrate" in the following description, previous process stages can have been conducted to form regions or junctions in the base semiconductor structure or foundation.

As used herein, the term "developable" means a material formulated to be selectively dissolved or otherwise removed by an appropriate developer or development process following exposure to an EUV energy source. Therefore, as used herein, a material referred to as "developable" can be selectively soluble within an appropriate developer or by a development process only following exposure to an appropriate energy source. For example, a positive tone photoresist is "developable" in that, following exposure to an appropriate wavelength of radiation or an appropriate chemical composition, the exposed segments of the positive tone photoresist can be removed by an appropriate developer material or by an appropriate development process in which only the exposed segments of the positive tone photoresist are soluble or removed. Likewise, a photoactive brush polymer material can be "developable" following exposure to an EUV energy source using standard etch chemistry or plasma ashing chemistry.

In aspects of the invention, one or more embodiments of the present invention are generally directed to photoactive polymer brush materials and methods for EUV photoresist patterning using the photoactive polymer brush materials. The photoactive polymer brush materials generally include a polymeric backbone having linked thereto a grafting moiety, a dry developable or ashable moiety, and a photoacid generator moiety. In one or more embodiments of the invention, the photoactive polymer brush materials can further include additional moieties having different functional groups as can be desired for different applications, e.g., functional groups that provide quenching, functional groups that provided desired dissolution properties, functional groups that provide light absorption, or the like. Still further, the grafting moiety can optionally be acid cleavable. The photoactive polymer brush materials can be formed by free radical polymerization or other known procedures of a grafting functionalized monomer (optionally, an acid cleavable grafting functional monomer), a dry developable or ashable monomer, and a photoacid generating functionalized monomer. Moreover, the photoacid generating moiety can be an ionic or a non-ionic bound photoacid generator depending on, among others, the desired acid generated upon exposure of the chemically amplified EUV photoresist. The polymeric backbone of the photoactive polymer brush materials can be in the form of polyacrylates, polymethacrylates, polystyrenes, mixtures thereof, or the like. The monomers forming the backbone of the polymer brushes can include, for example and without limitation, acrylate monomers, methacrylate monomers, styrenic monomers, hydroxyethylmethacrylate monomers, epoxydicyclopentadiene methacrylate monomers, or other known monomers of conventional photoresist materials including the above moieties linked thereto. For example, the different moieties can be linked to the carboxylic acid terminus of a polyacrylate.

In one or more embodiments, the photoactive polymer brush material has an average weight molecular weight of about 2 to about 500,000 Daltons. In one or more embodiments of the invention, the photoactive polymer brush material has an average weight molecular weight of about 3 to about 300,000 Daltons. In one or more embodiments of the invention, the photoactive polymer brush material has an average molecular weight of about 4 to about 100,000

Daltons as measured by gel permeation chromatography. The polydispersity index (PDI) of the polymers is from about 1 to about 5.

The photoactive polymer brush materials including the acid cleavable grafting functional group can be grafted onto a substrate in a self-limiting grafting reaction to produce a photoresponsive monolayer having a thickness typically less than about 8 nm at an interface between the substrate and the EUV photoresist. By grafting the photoactive polymer brush materials directly to the substrate, the photoacid generator functional group is immobilized at the substrate surface, which generates acid upon exposure to EUV radiation at the interface between the substrate and the photoresist to reduce and/or eliminate scumming caused by the photoresist as well as cleave the brush material from the substrate. In the event that the brush is not cleaved, it can be removed during a dry etch process (or ash like) before hardmask open. The activating radiation can be the same as that utilized to form a latent image in the chemically amplified EUV photoresist. The acid loading and acid strength provided upon exposure of the photoactive polymer brush material to activating radiation can be tuned for performance. In a similar manner, the dry developable/ashable moiety is immobilized at the substrate surface, which provides a means for complete removal of any remaining photoactive polymer brush material and any photoresist scumming from the substrate.

The grafting functional group can be selected from a number of different functionalities that will covalently attach to different substrate surfaces. The grafting functional group includes a grafting component and an optional acid cleavable component. By way of example, the grafting component can include an alkyne or alkene functional group, which can be used to attach the photoactive polymer brush material to substrates including hydrogen terminated surfaces such as Si—H. Other functional groups for grafting the photoactive polymer brush material to the substrate include, for example and without limitation, hydroxyls and amines, which will react with substrates including oxide surfaces, phosphonic acids, which will react with substrates including metal oxide surfaces and thiols, which will react with bare metal surfaces. The particular grafting component is not intended to be limited and will generally depend on the composition of the substrate surface. Non-covalent grafting moieties can also be included that lead to physically adsorbed polymers such as pending hydroxyl groups, carboxylic acids, or amines.

The acid cleavable component can include derivatives that are stable leaving groups making the grafting unit acid cleavable so that the photoactive polymer brush material, which can be up to about 10 nm thick, can be removed from the substrate surface upon exposure to acid generated from the photoacid generator moiety.

In one or more embodiments of the invention, the photoactive polymer brush materials can include two or more different acid cleavable grafting functional groups.

To facilitate complete photoactive polymer brush material removal, the majority (i.e., greater than about 50%) of the photoactive polymer brush material includes the dry developable or ashable moiety. The dry developable or ashable moiety is not intended to be limited and can be a methyl methacrylate, hexafluoro alcohol derivative, or the like, which can be tailored to the particular process of record for the etching or ashing process so as to effect complete removal from the substrate.

The bound photoacid generator monomer is not intended to be limited and can be either ionic or non-ionic. The loading can be varied as well as the acid strength provided, e.g., a strong acid similar in strength to a triflate functional group to weaker acids such as fluorinated aromatics and even non-fluorinated derivatives. The photoacid generator monomer generally includes a photoacid generating portion linked to a polymerizable portion and is capable of generating acid upon exposure to EUV radiation.

In various embodiments of the invention, any suitable photoacid generating agent can be used as the photoacid generating portion including ionic and non-ionic photoacid generating agents, so long as the selected photoacid generator can be linked to the polymerizable portion, dissolves sufficiently in the coating composition, and the resulting solution thereof can form a coating on a substrate by a dispensing process, or spin coating, or the like. As is well known to those skilled in the art after reading the present detailed description, the following illustrative classes of photoacid generators can be employed in various embodiments of the present invention.

Typical photoacid generator agents include, without limitation: (1) sulfonium salts, such as triphenylsulfonium perfluoromethanesulfonate (triphenylsulfonium triflate), triphenylsulfonium perfluorobutanesulfonate, triphenylsulfonium perfluoropentane-sulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluoro-butanesulfonate, 2,4,6-trimethylphenyldiphenylsulfonium benzenesulfonate, tris(t-butylphenyl)sulfonium perfluorooctane sulfonate, diphenylethylsulfonium chloride, and phenacyldimethylsulfonium chloride; (2) halonium salts, particularly iodonium salts, including diphenyliodonium perfluoromethanesulfonate (diphenyliodonium triflate), diphenyliodonium perfluorobutanesulfonate, diphenyliodonium perfluoropentane-sulfonate, diphenyliodonium perfluorooctanesulfonate, diphenyliodonium hexafluoroantimonate, diphenyliodonium hexafluoroarsenate, bis-(t-butylphenyl)-iodonium triflate, and bis-(t-butylphenyl)-iodonium camphanylsulfonate; (3) α,α'-bis-sulfonyldiazomethanes such as bis(p-toluenesulfonyl)diazomethane, methylsulfonyl p-toluenesulfonyldiazomethane, 1-cyclohexylsulfonyl-1-(1,1-dimethylethylsulfonyl) diazomethane, and bis(cyclohexylsulfonyl)diazomethane; (4) sulfonate esters of imides and hydroxyimides, e.g., α-(trifluoromethylsulfonyloxy)-bicyclo[2.2.1]hept-5-ene-2,3-dicarboximide (MDT); (5) nitrobenzyl sulfonate esters such as 2-nitrobenzyl p-toluenesulfonate, 2,6dinitrobenzyl p-toluenesulfonate, and 2,4-dinitrobenzyl p-trifluoromethylbenzene sulfonate; (6) sulfonyloxynaphthalimides such as N-camphorsulfonyloxynaphthalimide and N-pentafluorophenylsulfonyloxynaphthalimide; (7) pyrogallol derivatives (e.g., trimesylate of pyrogallol); (8) naphthoquinone-4-diazides; (9) alkyl disulfones; (10) s-triazine derivatives; and (11) miscellaneous sulfonic acid generators including t-butylphenyl-α-(p-toluenesulfonyloxy)acetate, t-butyl-α-(p-toluenesulfonyloxy)acetate, and N-hydroxynaphthalimide dodecane sulfonate (DDSN), and benzoin tosylate.

Additional suitable photoacid generators useful in conjunction with the coating compositions and methods provided herein will be known to those skilled in the art. Exemplary photoacid generator monomers suitable for use in the present application are described in U.S. Pat. No. 9,244,345, incorporated herein by reference in its entirety.

By way of non-limiting example, the photoactive polymer brush material can be an acrylate terpolymer as generally shown in Formula (I) below.

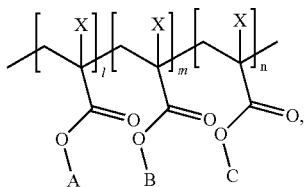

(I)

wherein A is the grafting moiety; B is the dry developable or ashable moiety; and C is the bound photoacid generator; wherein X can be selected from the group consisting of —H, —CH$_3$, —CH$_2$CH$_3$; and wherein/can be from 5 to 20 mol. %; m can be from 90 to 60 mol. %, and n can be from 5 to 20 mol. %.

Exemplary grafting moieties are shown below:

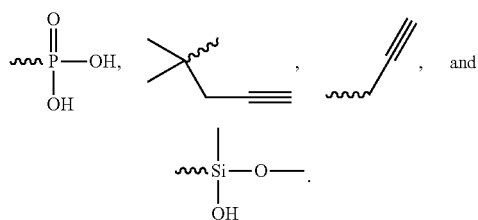

Exemplary dry developable or ashable moieties are shown below:

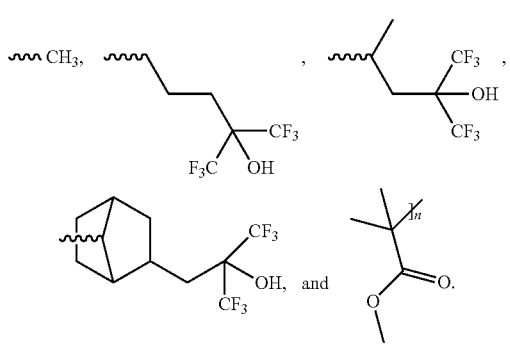

Exemplary ionic and non-ionic photoacid generator moieties are shown below:

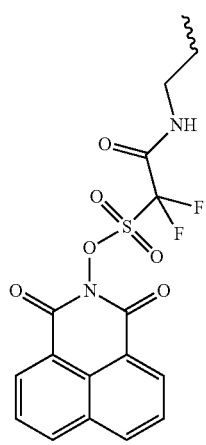

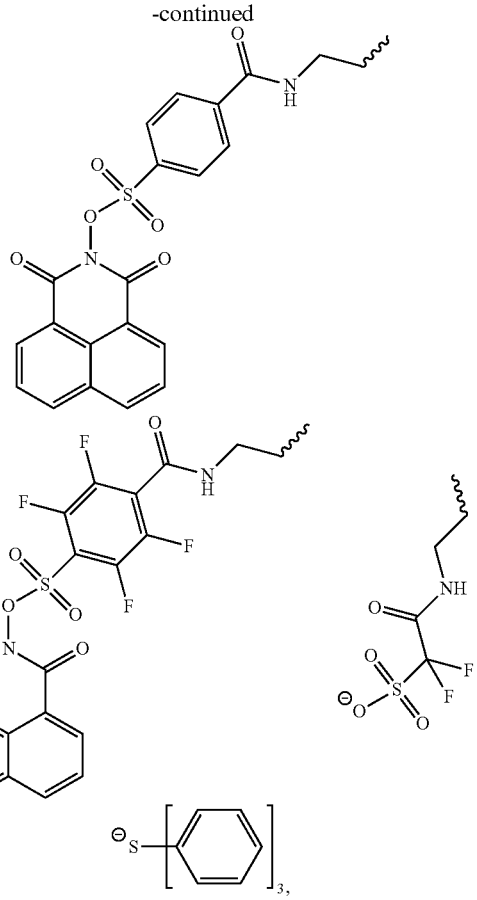

and

The photoactive polymer brush materials can be dissolved in a solvent and applied to the substrate. The choice of solvent is governed by many factors not limited to the solubility and miscibility of resist components, the coating process, safety and environmental regulations. Additionally, inertness to other resist components is desirable. It is also desirable that the solvent possess the appropriate volatility to allow uniform coating of films yet also allow significant reduction or complete removal of residual solvent during the post-application bake process. Solvents can generally be chosen from ether-, ester-, hydroxyl-, and ketone-containing compounds, or mixtures of these compounds. Examples of appropriate solvents include cyclopentanone, cyclohexanone, lactate esters such as ethyl lactate, alkylene glycol alkyl ether esters such as propylene glycol methyl ether acetate (PGMEA), alkylene glycol monoalkyl esters such as methyl cellosolve, butyl acetate, 2-ethoxyethanol, and ethyl 3-ethoxypropionate. The above list of solvents is for illustrative purposes only and should not be viewed as being comprehensive nor should the choice of solvent be viewed as limiting the invention in any way. Those skilled in the art will recognize that any number of solvents or solvent mixtures can be used. In one or more embodiments, greater than 50 percent of the total mass of the photoactive polymer brush formulation is composed of the solvent, and in one or more other embodiments, greater than 80 percent of the formulation is solvent.

The method for patterning the positive tone chemically amplified EUV photoresists using the photoactive polymer brushes generally includes grafting the photoactive polymer brush material to the substrate to form a photosensitive layer. The photoactive polymer brush material can be dissolved in a solvent and applied by spin coating, for example, followed by post apply baking at an elevated temperature to remove the solvent until the coating is tack-free. The post apply bake is at an elevated temperature in a range from 80° C. less than 200° C. for a period of time ranging from 1 less than 600 seconds. The applied coating of the photoactive polymer brush material can then be rinsed to remove excess photoactive polymer brush material, i.e., photoactive polymer brush material that was not grafted to the substrate. The thickness of the photoactive polymer brush material is less than about 8 nm.

Following deposition of the photoactive polymer brush material, a chemically amplified EUV photoresist is deposited thereon at a thickness generally ranging from 30 nm to 50 nm and lithographically patterned with EUV radiation at an exposure wavelength of 13.5 nm to form a relief image thereon. In the exposed areas, acid is generated in the EUV and acid catalyzed deprotection of acid labile groups within the chemically amplified photoresist occurs. Additionally, the underlying bound photoacid generator in the photoactive polymer brush polymer material is also photoactivated upon exposure to the same EUV radiation to generate acid at the interface between the substrate and the photoresist. The generated acid within the grafted monolayer reduces scumming of the photoresist and can also cleave grafting moiety from the substrate, thereby rendering the photoresist and the photoactive polymer brush material removable after development of the latent image in the chemically amplified EUV photoresist with an appropriate developer to form the relief image. Any residual photoactive polymer brush material and/or photoresist scumming still present can then be removed by dry development or by ashing. For example, the exposed photoactive polymer brush material can be removed with standard etch chemistry, e.g., $Cl_2$, $SF_6$, $HBr/O_2$ and the like or subjected to a plasma ashing process.

The descriptions of the various embodiments of the present invention have been presented for purposes of illustration, but are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. A photoactive polymer brush material comprising repeating units of:
   grafting moiety, wherein the grafting moiety comprises a grafting component selected from the group consisting of alkynes, alkenes, phosphonic acid, thiols, and silanes;
   a dry developable moiety; and
   a photoacid generating moiety, wherein the photoacid generating moiety is configured to decompose and form an acid upon exposure to EUV radiation.

2. The photoactive polymer brush material of claim 1, wherein the photoacid generating moiety comprises a non-ionic photoacid photosensitive to the EUV radiation.

3. The photoactive polymer brush material of claim 1, wherein the photoacid generating moiety comprises an ionic photoacid photosensitive to the EUV radiation.

4. The photoactive polymer brush material of claim 1, wherein the photoacid generator moiety comprises a photoacid generator component selected from the group consisting of sulfonium salts, halonium salts, α, α'-bis-sulfonyl-diazomethanes, sulfonate esters of imides and hydroxyimides, nitrobenzyl sulfonate esters, sulfonyloxynaphthalimides, pyrogallol derivatives, naphthoquinone-4-diazides, alkyl disulfones, s-triazine derivatives, and sulfonic acid generators.

5. The photoactive polymer brush material of claim 1, wherein the grafting moiety is from about 5 mol. % to about 20 mol. %, the dry developable moiety is from about 90 mol. % to about 60 mol. %, and the photoacid generating moiety is from about 5 mol. % to about 20 mol. % based upon total moles of repeating units of the polymer brush material.

6. The photoactive polymer brush material of claim 1, wherein the dry developable moiety comprises a methacrylate and/or a hexafluoro alcohol derivative.

7. The photoactive polymer brush material of claim 1, wherein the photoactive polymer brush material comprises an acrylate terpolymer of Formula (I):

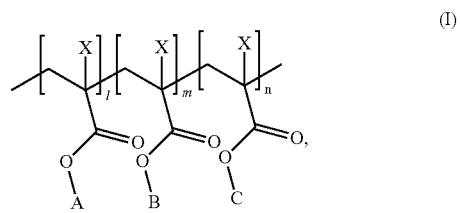

wherein A is the grafting moiety; B is the dry developable moiety; and C is a bound photoacid generator; wherein X is selected from the group consisting of —H, —$CH_3$, and —$CH_2CH_3$; and wherein/is from about 5 mol. % to about 20 mol. %; m is from about 90 mol. % to about 60 mol. %, and n is from about 5 mol. % to about 20 mol. % based upon total moles of repeating units of the acrylate terpolymer.

8. The photoactive polymer brush material of claim 7, wherein the bound photoacid generator comprises a sulfonium salt or an iodonium salt.

9. The photoactive polymer brush material of claim 1, wherein the bound photoacid generator comprises a sulfonate ester of imides and hydroxyimide.

10. The photoactive polymer brush material of claim 1, wherein the grafting moiety, the dry developable moiety, and the photoacid generator moeity are linked to a carboxylic acid terminus of a polyacrylate.

* * * * *